(12) United States Patent
Kusachi

(10) Patent No.: US 9,369,090 B2
(45) Date of Patent: Jun. 14, 2016

(54) HIGH-FREQUENCY AMPLIFIER CIRCUIT

(71) Applicant: Murata Manufacturing Co., Ltd., Kyoto (JP)

(72) Inventor: Keiji Kusachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/794,082

(22) Filed: Jul. 8, 2015

(65) Prior Publication Data

US 2015/0311867 A1  Oct. 29, 2015

Related U.S. Application Data

(63) Continuation of application No. PCT/JP2013/072950, filed on Aug. 28, 2013.

(30) Foreign Application Priority Data

Jan. 9, 2013  (JP) .................................. 2013-001593

(51) Int. Cl.
*H03F 1/02* (2006.01)
*H03F 3/21* (2006.01)
(Continued)

(52) U.S. Cl.
CPC ............ *H03F 1/0205* (2013.01); *H03F 1/0266* (2013.01); *H03F 1/52* (2013.01); *H03F 3/19* (2013.01); *H03F 3/191* (2013.01); *H03F 3/195* (2013.01); *H03F 3/211* (2013.01); *H03F 3/217* (2013.01); *H03F 2200/105* (2013.01); *H03F 2200/411* (2013.01); *H03F 2200/451* (2013.01); *H03F 2200/555* (2013.01)

(58) Field of Classification Search
USPC .......................... 330/136, 285, 296–297, 289
See application file for complete search history.

(56) References Cited

U.S. PATENT DOCUMENTS 7,567,123 B2 *  7/2009  Leung .................... H03F 1/0266
                                                 330/136
8,089,313 B2 *  1/2012  Chang .................... H03F 1/0266
                                                 330/136
(Continued)

FOREIGN PATENT DOCUMENTS

JP  S57-4813 U  1/1982
JP  H05-29843 A  2/1993
(Continued)

OTHER PUBLICATIONS

International Search Report issued in Application No. PCT/JP2013/072950 dated Dec. 3, 2013.
(Continued)

*Primary Examiner* — Hieu Nguyen
(74) *Attorney, Agent, or Firm* — Pearne & Gordon LLP

(57) ABSTRACT

A high-frequency amplifier circuit (10) includes a high-frequency amplifying element (11), a bias circuit (12), and a bias adjusting circuit (13). The high-frequency amplifying element (11) includes an input end and an output end. The bias circuit (12) is connected to the high-frequency amplifying element (11) and supplies a first bias voltage to an input side of the high-frequency amplifying element (11). The bias adjusting circuit (13) is connected between the input end and the bias circuit (12) and adjusts the first bias voltage based on a high-frequency signal inputted to the input end. The bias adjusting circuit (13) includes a lumped element and an active element.

25 Claims, 7 Drawing Sheets

(51) Int. Cl.
*H03F 3/19* (2006.01)
*H03F 1/52* (2006.01)
*H03F 3/195* (2006.01)
*H03F 3/217* (2006.01)
*H03F 3/191* (2006.01)

(56) References Cited

U.S. PATENT DOCUMENTS 8,912,851 B2 * 12/2014 Pinarello ............... H03F 1/0272
330/285
2010/0026390 A1 2/2010 Koizumi

FOREIGN PATENT DOCUMENTS

| | | |
|---|---|---|
| JP | 3035921 B2 | 4/2000 |
| JP | 2005-079967 A | 3/2005 |
| JP | 2008-004987 A | 1/2008 |
| JP | 2010-041233 A | 2/2010 |

OTHER PUBLICATIONS

Translation of Written Opinion issued in Application No. PCT/JP2013/072950 dated Dec. 3, 2013.

* cited by examiner

HIGH-FREQUENCY AMPLIFIER CIRCUIT

FIELD OF THE DISCLOSURE

The present disclosure relates to high-frequency amplifier circuits that suppress breakdowns due to an excessive input.

DESCRIPTION OF THE RELATED ART

Many high-frequency amplifier circuits are provided with a function for adjusting a bias voltage based on an input signal in order to prevent breakdowns due to an excessive input. The circuit disclosed in Patent Document 1 is an example of such a high-frequency amplifier circuit.

The high-frequency amplifier circuit described in Patent Document 1 includes a directional coupler, a diode, and a transistor. The directional coupler is connected between an input end and a base end of the transistor. An anode of the diode is connected to an emitter end of the transistor, and a cathode of the diode is grounded. One end of the directional coupler is connected to the anode of the diode.

In this high-frequency amplifier circuit, an input power is partially detected by the directional coupler, and that power produces a current flowing in the diode. Accordingly, a forward voltage of the diode is applied to the base end. As a result, even in the case of an excessive input, a reverse bias is not applied between the base and emitter, and the transistor can be prevented from breaking down.

Patent Document 1: Japanese Patent No. 3035921

BRIEF SUMMARY OF THE DISCLOSURE

The high-frequency amplifier circuit described in Patent Document 1 detects an input signal using the directional coupler. However, it is extremely difficult to design a directional coupler capable of obtaining a suitable signal level, and thus a threshold used when detecting an excessive input cannot be easily set in such a high-frequency amplifier circuit. In addition, because a directional coupler is larger than an equivalent of lumped element, the size of such a high-frequency amplifier circuit cannot easily be reduced.

It is an object of the present disclosure to provide a high-frequency amplifier circuit that does not break down due to an excessive input, in which a threshold for detecting the excessive input can be easily set, and whose size is further reduced.

A high-frequency amplifier circuit according to the present disclosure includes a high-frequency amplifying element, a bias circuit, and a bias adjusting circuit. The high-frequency amplifying element includes an input end and an output end. The bias circuit is connected to the high-frequency amplifying element and supplies a first bias voltage to an input side of the high-frequency amplifying element. The bias adjusting circuit is connected between the input end and the bias circuit and adjusts the first bias voltage based on a high-frequency signal inputted to the input end. The bias adjusting circuit includes lumped elements and active elements.

According to this configuration, an output power of the high-frequency amplifying element can be adjusted based on the high-frequency signal inputted to the input end. As a result, the high-frequency amplifier circuit operates in a stable operating region even in the case of an excessive input. Accordingly, the high-frequency amplifier circuit can be prevented from breaking down due to the excessive input.

In addition, a threshold used when detecting an excessive input can be easily adjusted as compared to a case of detecting the excessive input using a distributed element such as a directional coupler. Furthermore, the high-frequency amplifier circuit can be made smaller as compared to a high-frequency amplifier circuit that uses a distributed element such as a directional coupler.

The high-frequency amplifier circuit can be prevented from breaking down due to an excessive input. In addition, because the bias adjusting circuit is constituted by a lumped element, a threshold for detecting the excessive input can be easily set and the size of the high-frequency amplifier circuit can be reduced.

DETAILED DESCRIPTION OF THE DISCLOSURE

First Embodiment

Figure 1:
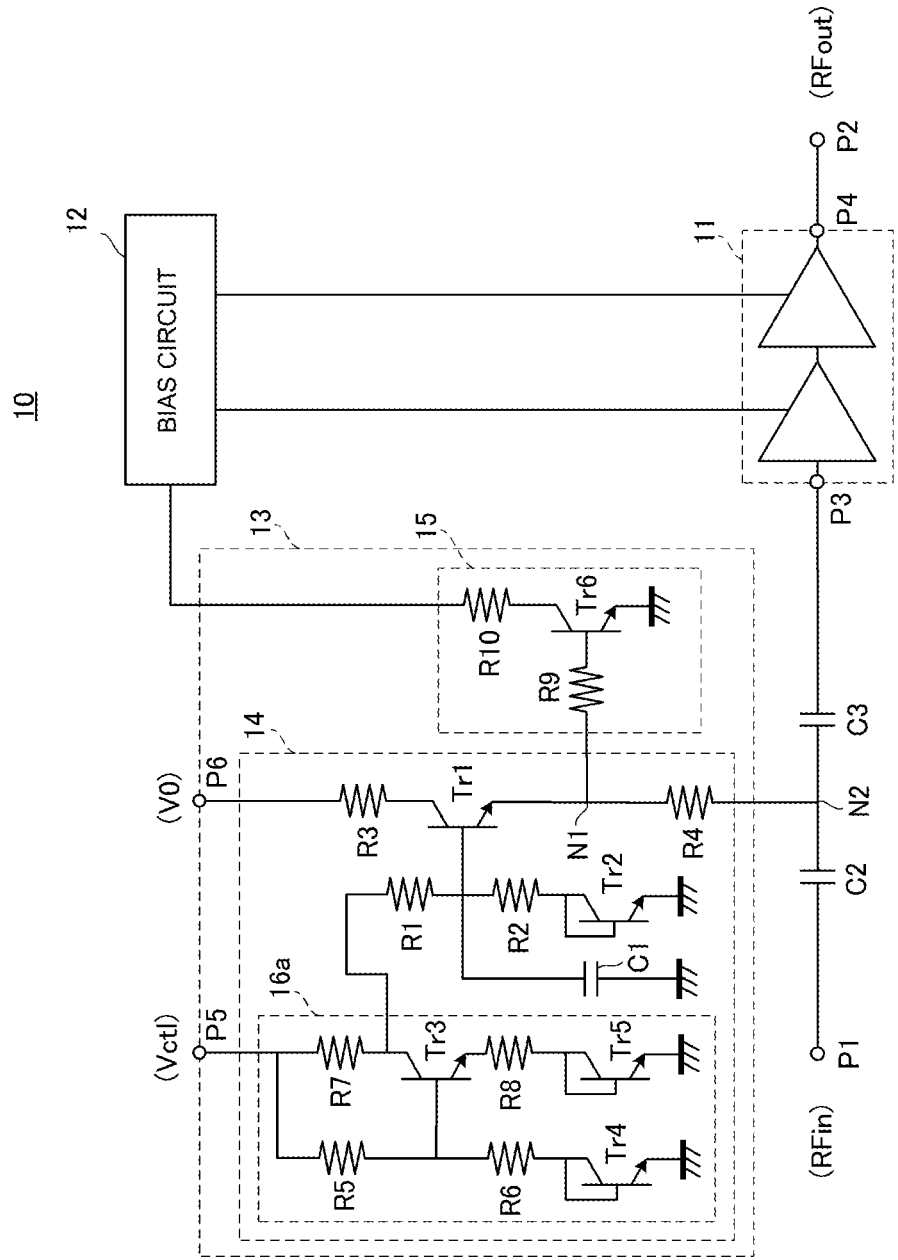
FIG. 1 is a circuit diagram illustrating a high-frequency amplifier circuit 10 according to a first embodiment.

A high-frequency amplifier circuit 10 according to a first embodiment of the present disclosure will be described. FIG. 1 is a circuit diagram illustrating the high-frequency amplifier circuit 10. The high-frequency amplifier circuit 10 includes a high-frequency amplifying element 11, a bias circuit 12, and a bias adjusting circuit 13. The high-frequency amplifier circuit 10 is formed within a single IC chip, for example.

The high-frequency amplifying element 11 has an input end P3, an output end P4, and two cascade-connected amplifying elements. The input end P3 is connected to a terminal P1 via capacitors C2 and C3 that are connected in series. The output end P4 is connected to a terminal P2. The high-frequency amplifying element 11 amplifies a high-frequency signal inputted from the input end P3 and outputs the amplified signal to the output end P4. The bias circuit 12 is connected to the high-frequency amplifying element 11 and supplies a first bias voltage to an input side of the high-frequency amplifying element 11. The bias adjusting circuit 13 is connected to a node N2 between the capacitor C2 and the capacitor C3, and is connected to the bias circuit 12.

The bias adjusting circuit 13 has a signal detecting circuit 14, a switching circuit 15, and terminals P5 and P6. The signal detecting circuit 14 is connected to the node N2, the switching circuit 15, and the terminals P5 and P6. The switching circuit 15 is connected to the bias circuit 12. Note that the terminal P5 is connected to a DC power source Vct1, and the terminal P6 is connected to a DC power source V0.

The signal detecting circuit 14 has transistors Tr1 and Tr2, resistors R1 to R4, a capacitor C1, and a circuit 16a. The resistor R4 corresponds to a signal detecting element according to the present disclosure. The transistor Tr1 corresponds to a rectifier element and a second transistor according to the present disclosure. The capacitor C1 corresponds to a first capacitor according to the present disclosure. Note that in the first embodiment, the transistors that constitute the bias adjusting circuit 13 are all npn transistors.

A base end of the transistor Tr1 is connected to a first end of the resistors R1 and R2 and a first end of the capacitor C1. A second end of the resistor R1 is connected to the circuit 16a. The circuit 16a is connected to the terminal P5. A second end of the resistor R2 is connected to a base end and a collector end of the transistor Tr2. An emitter end of the transistor Tr2 is grounded. A second end of the capacitor C1 is grounded. A collector end of the transistor Tr1 is connected to the terminal P6 via the resistor R3. An emitter end of the transistor Tr1 is connected to the node N2 via the resistor R4. A node N1 between the emitter end of the transistor Tr1 and the resistor R4 is connected to the switching circuit 15.

The circuit 16a has transistors Tr3, Tr4, and Tr5, and resistors R5 to R8. A base end of the transistor Tr3 is connected to a first end of the resistors R5 and R6. A second end of the resistor R5 is connected to the terminal P5. A second end of the resistor R6 is connected to a base end and a collector end of the transistor Tr4. An emitter end of the transistor Tr4 is grounded. A collector end of the transistor Tr3 is connected to the terminal P5 via the resistor R7. A node between the collector end of the transistor Tr3 and the resistor R7 is connected to the second end of the resistor R1. An emitter end of the transistor Tr3 is connected to a base end and a collector end of the transistor Tr5 via the resistor R8. An emitter end of the transistor Tr5 is grounded.

The switching circuit 15 has a transistor Tr6 and resistors R9 and R10. The transistor Tr6 corresponds to a first transistor according to the present disclosure. A base end of the transistor Tr6 is connected to the node N1 within the bias adjusting circuit 13 via the resistor R9. A collector end of the transistor Tr6 is connected to the bias circuit 12 via the resistor R10. An emitter end of the transistor Tr6 is grounded.

Figure 2:
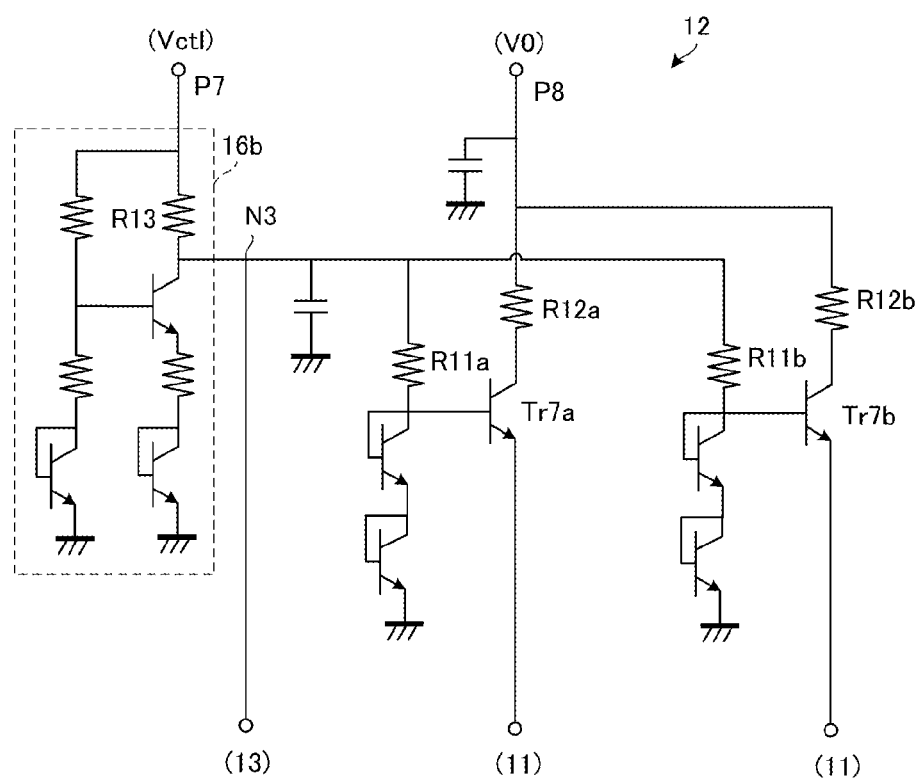
FIG. 2 is a circuit diagram illustrating a bias circuit 12.

FIG. 2 is a circuit diagram illustrating the bias circuit 12. The bias circuit 12 has a circuit 16b, resistors R11a, R11b, R12a, and R12b, transistors Tr7a and Tr7b, and terminals P7 and P8. The configuration of the circuit 16b is the same as the configuration of the circuit 16a, and thus detailed descriptions of the circuit 16b will be omitted.

A base end of the transistor Tr7a is connected to a first end of the resistor R13 included in the circuit 16b via the resistor R11a. A second end of the resistor R13 is connected to the terminal P7. A voltage supplied to the base end of the transistor Tr7a is supplied from the DC power source Vct1, which is connected to the terminal P7. A node N3 between the resistor R11a and the resistor R13 is connected to the resistor R10 in the bias adjusting circuit 13.

A collector end of the transistor Tr7a is connected to the terminal P8 via the resistor R12a. A voltage supplied to the collector end of the transistor Tr7a is supplied from the DC power source V0, which is connected to the terminal P8. An emitter end is connected to the amplifying element in a first stage of the high-frequency amplifying element 11.

A circuit constituted by the transistor Tr7b and the resistors R11b and R12b is the same as a circuit constituted by the transistor Tr7a and the resistors R11a and R12a, and thus detailed descriptions of this circuit will be omitted. However, an emitter end of the transistor Tr7b is connected to the amplifying element in a last stage of the high-frequency amplifying element 11.

Figure 3:
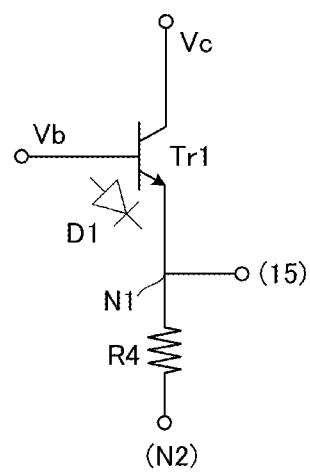
FIG. 3(A) is a circuit diagram illustrating a part of a signal detecting circuit 14.
FIG. 3(B) is a diagram illustrating a change over time in a voltage at a node N1 when a high-frequency signal has been inputted.
Figure 3:
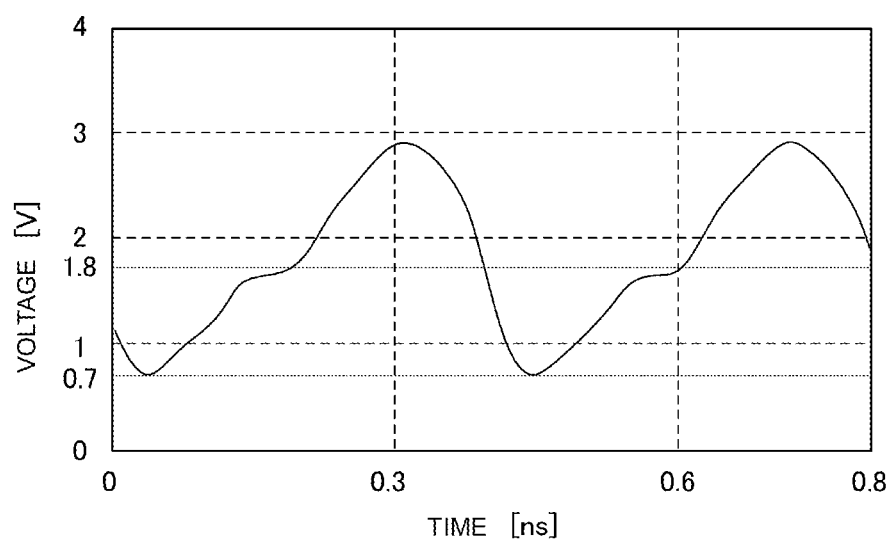

FIG. 3(A) is a circuit diagram illustrating a part of the signal detecting circuit 14. A bias voltage Vb supplied to the base end of the transistor Tr1 corresponds to a second bias voltage according to the present disclosure. A bias voltage Vc supplied to the collector end of the transistor Tr1 corresponds to a third bias voltage according to the present disclosure. A diode D1 is realized by a pn junction between the base and emitter of the transistor Tr1, and corresponds to a rectifier element according to the present disclosure.

An emitter voltage of the transistor Tr1 (called simply an emitter voltage hereinafter) produced by the bias voltages Vb and Vc is lower than the bias voltage Vb by a forward voltage drop of the diode D1.

Meanwhile, the base end of the transistor Tr1 is grounded AC-wise by the capacitor C1. Accordingly, even if a high-frequency signal inputted from the node N1 has leaked to the base end of the transistor Tr1, a base voltage of the transistor Tr1 can continuously remain at the bias voltage Vb. As a result, a voltage at the node N1 does not drop below a voltage lower than the bias voltage Vb by the forward voltage drop of the diode D1.

When a high-frequency signal is inputted to the terminal P1, a part of the high-frequency signal is taken into the signal detecting circuit 14 by the resistor R4. The voltage at the node N1 is thus a composite voltage of the voltage of the high-frequency signal taken in and the emitter voltage. This composite voltage corresponds to a voltage in which a portion that is lower than a voltage in the vicinity of the emitter voltage is clipped by the diode D1 from a voltage waveform obtained by simply combining the voltage of the high-frequency signal taken in and the emitter voltage. Accordingly, when an amplitude of the high-frequency signal inputted to the terminal P1 (called an input signal hereinafter) rises, a minimum voltage does not change and a maximum voltage increases. As a result, an average voltage at the node N1 rises.

FIG. 3(B) is a diagram illustrating a change over time in the voltage at the node N1 when a 15 dBm high-frequency signal has been inputted to the terminal P1. The bias voltage Vb here is 2.25 V. The emitter voltage is 1 V. The voltage at the node N1 does not drop below approximately 0.7 V, which is a voltage lower than the emitter voltage by approximately 0.3 V. The average voltage at the node N1 is approximately 1.8 V. Note that the dotted lines indicate 0.7 V and 1.8 V.

When the average voltage at the node N1 becomes greater than or equal to a threshold, the transistor Tr6 of the switching circuit 15 turns on and a voltage between the collector and emitter of the transistor Tr6 drops. Accordingly, a voltage at the node N3 to which the collector end of the transistor Tr6 is connected via the resistor R10 drops, and a base voltage of the transistors Tr7a and Tr7b drops. As a result, the first bias voltage supplied to the input side of the high-frequency amplifying element 11 drops and the output current and output power of the high-frequency amplifying element 11 drop.

Note that the transistor Tr6 is a GaAs HBT (Heterojunction Bipolar Transistor), a Si transistor, a SiGe transistor, or the like, for example. The threshold in a GaAs HBT is approximately 1.25 V, and the thresholds in a Si transistor and a SiGe transistor are approximately 0.7 V. The transistor Tr6 may be an FET.

Figure 4:
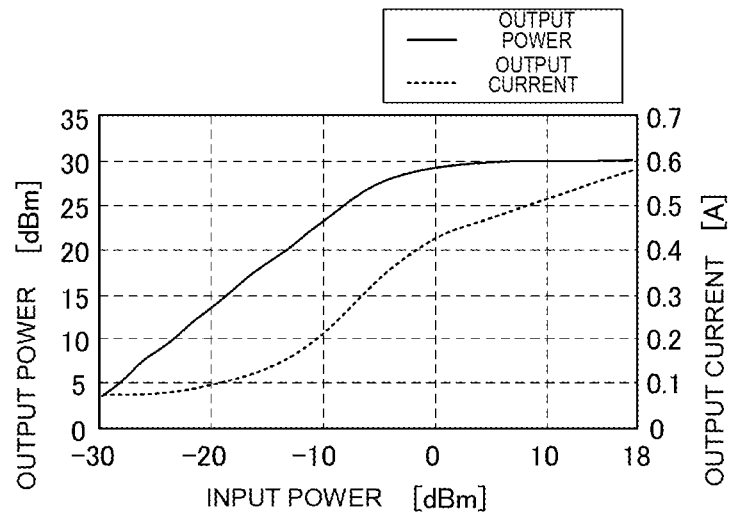
FIG. 4(A) is characteristics illustrating an output power and an output current relative to an input power in a conventional high-frequency amplifier circuit.
FIG. 4(B) is characteristics illustrating an output power and an output current relative to an input power in a high-frequency amplifier circuit 10.
Figure 4:
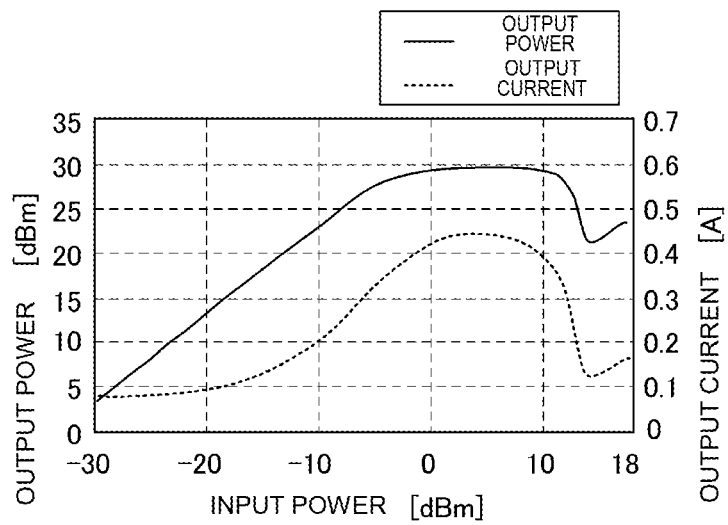

FIG. 4(A) is characteristics illustrating an output power and an output current relative to an input power in a conventional high-frequency amplifier circuit. FIG. 4(B) is a diagram illustrating an output power and an output current relative to an input power in the high-frequency amplifier circuit 10. Here, the conventional high-frequency amplifier circuit is constituted only by the high-frequency amplifying element 11 and the bias circuit 12.

In the conventional high-frequency amplifier circuit, when the input power is less than approximately 0 dBm, the input power rises, and thus the output power rises. When the input power becomes greater than or equal to approximately 0 dBm, the output power enters a saturation region and becomes approximately 30 dBm. Meanwhile, the output current increases monotonically as the input power increases.

In the high-frequency amplifier circuit 10 according to the present disclosure, when the input power is less than approximately 10 dBm, a change in the output power relative to the input power is the same as in the case of the conventional high-frequency amplifier circuit. However, when the input power becomes greater than or equal to approximately 10 dBm, the output power drops greatly. As a result, the output power is greatest when the input power is approximately 5 dBm.

Meanwhile, when the input power is less than approximately 10 dBm, a change in the output current relative to the input power is the same as in the case of the conventional high-frequency amplifier circuit. However, when the input power becomes greater than or equal to approximately 10 dBm, the output current drops greatly. As a result, the output current is greatest when the input power is approximately 5 dBm.

FIG. 5(A) is characteristics illustrating a load line of an amplifying element in a last stage of a high-frequency amplifying element 11 in a conventional high-frequency amplifier circuit. FIG. 5(B) is a diagram illustrating respective load lines of the amplifying element in the last stage of the high-frequency amplifying element 11 in the high-frequency amplifier circuit 10 according to the present disclosure. A vertical axis represents a collector current and a horizontal axis represents a voltage between the collector and emitter.

Figure 5:
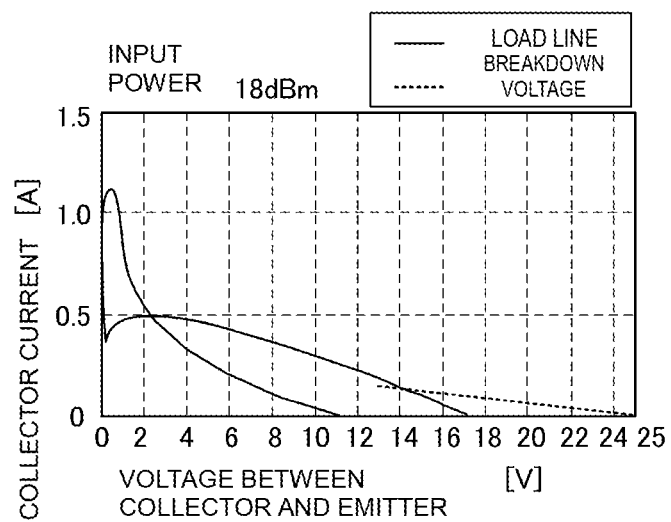
FIG. 5(A) is a diagram illustrating a load line of an amplifying element in a last stage of a high-frequency amplifying element 11 in a conventional high-frequency amplifier circuit.
FIG. 5(B) is a diagram illustrating a load line of an amplifying element in a last stage of a high-frequency amplifying element 11 in a high-frequency amplifier circuit 10.
Figure 5:
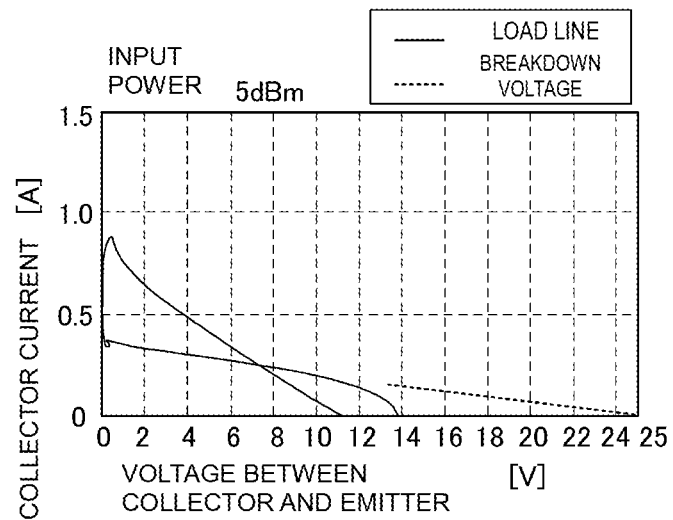

Here, the amplifying element in the last stage of the high-frequency amplifying element 11 is constituted by an npn transistor, and a voltage of 4.5 V is supplied to a collector end of the npn transistor. FIG. 5(A) indicates a load line measured when an 18 dBm high-frequency signal is inputted to the terminal P1. FIG. 5(B) indicates a load line measured when a 5 dBm high-frequency signal is inputted to the terminal P1. Note that the value of a breakdown voltage indicated in FIG. 5 is a result of measuring a voltage when a voltage is applied between the collector and emitter of the npn transistor that constitutes the amplifying element in the last stage of the high-frequency amplifying element 11 and that npn transistor has broken down.

Trajectories of the respective load lines are greatest at an input power of 18 dBm in the conventional high-frequency amplifier circuit and at an input power of 5 dBm in the high-frequency amplifier circuit 10 according to the present disclosure. In other words, the respective input powers are conditions at which the high-frequency amplifying element 11 breaks down most easily.

In the conventional high-frequency amplifier circuit, a dotted line indicating the breakdown voltage and the load line intersect. Accordingly, the high-frequency amplifying element 11 breaks down in the case where an 18 dBm high-frequency signal has been inputted.

On the other hand, in the high-frequency amplifier circuit 10 according to the present disclosure, the load line is closest to the breakdown voltage when the input power is approximately 5 dBm, reflecting the fact that the output power is greatest when the input power is approximately 5 dBm. However, the dotted line indicating the breakdown voltage and the load line do not intersect even at this time. In other words, the high-frequency amplifying element 11 does not break down even under an excessive input, and operates normally.

Next, the setting of thresholds and the roles of the respective circuit elements will be described. A bias voltage at the node N1 is set using resistor divider of R1 and R2. Meanwhile, of the input power, the power taken into the signal detecting circuit 14 is adjusted by a value of the resistor R4. Accordingly, a threshold used when the bias adjusting circuit 13 detects the excessive input can be adjusted by the values of the resistors R1, R2, and R4. The transistor Tr2 compensates for changes in the bias voltage Vb supplied to the base end of the transistor Tr1 caused by temperature changes. Through this, the transistor Tr2 compensates the emitter voltage of the transistor Tr1. The circuit 16a absorbs fluctuations in the DC power source Vct1 and ensures that the fluctuations in the DC power source Vct1 are not transmitted to the node N1.

The extent to which the base voltages of the transistors Tr7a and Tr7b are reduced is adjusted by the resistor R10. The base voltages of the transistors Tr7a and Tr7b can be greatly reduced by reducing the resistor value of the resistor R10.

According to the first embodiment, a part of the input signal is taken in by the signal detecting circuit 14. During an excessive input, the value detected by the signal detecting circuit 14 is greater than or equal to a threshold of the switching circuit 15. The switching circuit 15 turns on, and the first bias voltage supplied by the bias circuit 12 drops. Accordingly, the output current and output power of the high-frequency amplifying element 11 drop. The high-frequency amplifier circuit 10 operates in a stable operating region as a result. Accordingly, the high-frequency amplifier circuit 10 can be prevented from breaking down due to the excessive input.

Meanwhile, the bias adjusting circuit 13 includes lumped elements and active elements. Furthermore, the switching circuit 15 can be realized using a single transistor. Accordingly, the high-frequency amplifier circuit 10 can be made smaller as compared to a high-frequency amplifier circuit that uses a distributed element.

In addition, the signal detecting circuit 14 according to the present disclosure detects an excessive input using the composite voltage of the voltage of the high-frequency signal taken in by the resistor R4 and the emitter voltage of the transistor Tr1. Accordingly, the high-frequency signal needed to detect the excessive input needs not necessarily be large.

However, with a high-frequency amplifier circuit that uses a directional coupler to detect an excessive input (see Patent Document 1, for example), a voltage sufficient to drive the diode is supplied using only the high-frequency signal. Accordingly, the high-frequency signal needed to detect the excessive input is greater than in the high-frequency amplifier circuit 10 according to the present disclosure.

With respect to this point, as compared to the conventional technique of using a directional coupler to detect an excessive input, the high-frequency amplifier circuit 10 according to the present disclosure can determine the excessive input while ensuring a low amount of power loss of the high-frequency signal that enters the high-frequency amplifying element 11, and thus the amount of power loss of the high-frequency signal can be reduced.

In addition, the bias adjusting circuit 13 is not inserted directly between the input end P3 of the high-frequency amplifying element 11 and the terminal P1. Furthermore, the bias adjusting circuit 13 operates only during an excessive input. Accordingly, high-frequency characteristics such as gain, P1 dB (1 dB Compression Point), EVM (Error Vector Magnitude), and so on are not affected.

Second Embodiment

Figure 6:
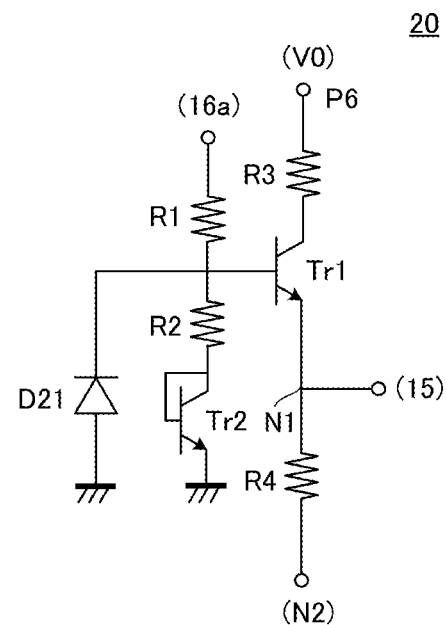
FIG. 6 is a circuit diagram illustrating a part of a high-frequency amplifier circuit according to a second embodiment.

A high-frequency amplifier circuit 20 according to a second embodiment of the present disclosure will be described. FIG. 6 is a circuit diagram illustrating a part of the high-frequency amplifier circuit 20. The high-frequency amplifier circuit 20 includes a diode D21 in place of the capacitor C1 of the high-frequency amplifier circuit 10. A cathode of the diode D21 is connected to the base end of the transistor Tr1. An anode of the diode D21 is grounded. Other configurations are the same as in the high-frequency amplifier circuit 10.

According to the second embodiment, the base end of the transistor Tr1 is grounded AC-wise using a capacitance produced by a pn junction of the diode D21. Accordingly, the high-frequency amplifier circuit 40 can be reduced in size as compared to a case where a bypass capacitor such as an MIMC (Metal-Insulator-Metal Capacitor) is used as the capacitor C1.

In addition, the high-frequency amplifier circuit 20 can be protected from an excessive input in the same manner as in the first embodiment. Furthermore, a threshold used when detecting the excessive input can be easily adjusted.

Third Embodiment

Figure 7:
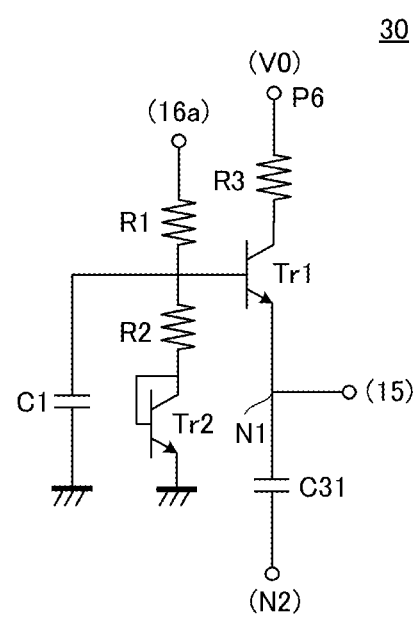
FIG. 7 is a circuit diagram illustrating a part of a high-frequency amplifier circuit according to a third embodiment.

A high-frequency amplifier circuit 30 according to a third embodiment of the present disclosure will be described. FIG. 7 is a circuit diagram illustrating a part of the high-frequency amplifier circuit 30. The high-frequency amplifier circuit 30 includes a capacitor C31 in place of the resistor R4 of the high-frequency amplifier circuit 10. The capacitor C31 corresponds to a second capacitor according to the present disclosure. Other configurations are the same as in the high-frequency amplifier circuit 10.

According to the third embodiment, the high-frequency signal can be taken in using the capacitor C31. The magnitude of an impedance of the capacitor C31 is lower in higher frequency bands than in lower frequency bands, and thus it is easier for the high-frequency signal to enter the node N1. Accordingly, the average voltage at the node N1 is higher in higher frequency bands than in lower frequency bands. As a result, frequency characteristics can be contributed to a sensitivity for detecting an excessive input.

In addition, the high-frequency amplifier circuit 30 can be protected from an excessive input in the same manner as in the first embodiment. Furthermore, frequency characteristics of a level of the excessive input can be adjusted.

Fourth Embodiment

Figure 8:
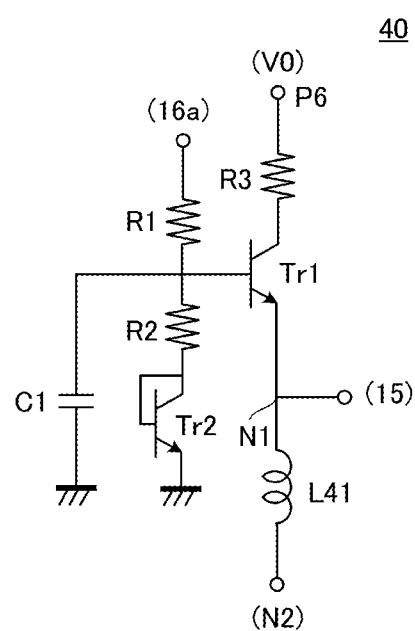
FIG. 8 is a circuit diagram illustrating a part of a high-frequency amplifier circuit according to a fourth embodiment.

A high-frequency amplifier circuit 40 according to a fourth embodiment of the present disclosure will be described. FIG. 8 is a circuit diagram illustrating a part of the high-frequency amplifier circuit 40. The high-frequency amplifier circuit 40 includes an inductor L41 in place of the resistor R4 of the high-frequency amplifier circuit 10. Other configurations are the same as in the high-frequency amplifier circuit 10.

According to the fourth embodiment, the high-frequency signal can be taken in using the inductor L41. The magnitude of an impedance of the inductor L41 is lower in lower frequency bands than in higher frequency bands, and thus it is easier for the high-frequency signal to enter the node N1. Accordingly, the average voltage at the node N1 is higher in lower frequency bands than in higher frequency bands. As a result, frequency characteristics can be applied to a sensitivity for detecting an excessive input.

In addition, the high-frequency amplifier circuit 40 can be protected from an excessive input in the same manner as in the first embodiment. Furthermore, frequency characteristics of a level of the excessive input can be easily adjusted.

C1 CAPACITOR (FIRST CAPACITOR)
C31 CAPACITOR (SECOND CAPACITOR)
C2, C3 CAPACITOR
D1, D21 DIODE
L41 INDUCTOR
N1, N2, N3 NODE
P1, P2, P5, P6, P7, P8 TERMINAL
P3 INPUT TERMINAL
P4 OUTPUT TERMINAL
R4 RESISTANCE (SIGNAL DETECTING ELEMENT)
R1-R3, R5-R10, R11a, R11b, R12a, R12b, R13 RESISTANCE
Tr1 TRANSISTOR (RECTIFIER ELEMENT, SECOND TRANSISTOR)
Tr6 TRANSISTOR (FIRST TRANSISTOR)
Tr2-Tr5, Tr7a, Tr7b TRANSISTOR
V0, Vct1 DC POWER SOURCE
Vb BIAS VOLTAGE (SECOND BIAS VOLTAGE)
Vc COLLECTOR VOLTAGE (THIRD BIAS VOLTAGE)
10, 20, 30, 40 HIGH-FREQUENCY AMPLIFIER CIRCUIT
11 HIGH-FREQUENCY AMPLIFYING ELEMENT
12 BIAS CIRCUIT
13 BIAS ADJUSTING CIRCUIT
14 SIGNAL DETECTING CIRCUIT
15 SWITCHING CIRCUIT
16a, 16b CIRCUIT

The invention claimed is:

1. A high-frequency amplifier circuit comprising:
    a high-frequency amplifying element including an input end and an output end;
    a bias circuit that is connected to the high-frequency amplifying element and that supplies a first bias voltage to an input side of the high-frequency amplifying element; and
    a bias adjusting circuit that is connected between the input end and the bias circuit and that adjusts the first bias voltage based on a high-frequency signal inputted to the input end, the bias adjusting circuit including a lumped element and an active element,
    wherein the bias adjusting circuit includes a signal detecting circuit and a switching circuit;
    the signal detecting circuit is connected to the input end and the switching circuit, detects the high-frequency signal, and outputs a detected value to the switching circuit; and
    the switching circuit is connected to the bias circuit and reduces the first bias voltage when the detected value is greater than or equal to a threshold.

2. The high-frequency amplifier circuit according to claim 1,
    wherein the switching circuit includes a first transistor;
    an emitter end of the first transistor is grounded;

a base end of the first transistor is connected to the signal detecting circuit; and a collector end of the first transistor is connected to the bias circuit.

3. The high-frequency amplifier circuit according to claim 1, wherein the signal detecting circuit includes a signal detecting element, a rectifier element, and a first capacitor;

a first end of the signal detecting element is connected to the input end;

a second end of the signal detecting element is connected to a cathode of the rectifier element and the switching circuit;

an anode of the rectifier element is connected to a first end of the first capacitor; and a second end of the first capacitor is grounded.

4. The high-frequency amplifier circuit according to claim 3, wherein the rectifier element is constituted by a second transistor;

an emitter end of the second transistor is used as the cathode of the rectifier element;

a base end of the second transistor is used as the anode of the rectifier element;

a second bias voltage is supplied to the base end of the second transistor; and a third bias voltage is supplied to a collector end of the second transistor.

5. The high-frequency amplifier circuit according to claim 3, wherein the first capacitor is used as a junction capacitance of a diode;

the first end of the first capacitor is a cathode of the diode; and the second end of the first capacitor is an anode of the diode.

6. The high-frequency amplifier circuit according to claim 3, wherein the signal detecting element is constituted by a resistor.

7. The high-frequency amplifier circuit according to claim 3, wherein the signal detecting element is constituted by a second capacitor.

8. The high-frequency amplifier circuit according to claim 3, wherein the signal detecting element is constituted by an inductor.

9. The high-frequency amplifier circuit according to claim 1, wherein the high-frequency amplifying element, the bias circuit, and the bias adjusting circuit are formed within a single IC chip.

10. The high-frequency amplifier circuit according to claim 2, wherein the signal detecting circuit includes a signal detecting element, a rectifier element, and a first capacitor;

a first end of the signal detecting element is connected to the input end;

a second end of the signal detecting element is connected to a cathode of the rectifier element and the switching circuit;

an anode of the rectifier element is connected to a first end of the first capacitor; and a second end of the first capacitor is grounded.

11. The high-frequency amplifier circuit according to claim 4, wherein the first capacitor is used as a junction capacitance of a diode;

the first end of the first capacitor is a cathode of the diode; and the second end of the first capacitor is an anode of the diode.

12. The high-frequency amplifier circuit according to claim 4, wherein the signal detecting element is constituted by a resistor.

13. The high-frequency amplifier circuit according to claim 5, wherein the signal detecting element is constituted by a resistor.

14. The high-frequency amplifier circuit according to claim 4, wherein the signal detecting element is constituted by a second capacitor.

15. The high-frequency amplifier circuit according to claim 5, wherein the signal detecting element is constituted by a second capacitor.

16. The high-frequency amplifier circuit according to claim 4, wherein the signal detecting element is constituted by an inductor.

17. The high-frequency amplifier circuit according to claim 5, wherein the signal detecting element is constituted by an inductor.

18. The high-frequency amplifier circuit according to claim 13, wherein the high-frequency amplifying element, the bias circuit, and the bias adjusting circuit are formed within a single IC chip.

19. The high-frequency amplifier circuit according to claim 2, wherein the high-frequency amplifying element, the bias circuit, and the bias adjusting circuit are formed within a single IC chip.

20. The high-frequency amplifier circuit according to claim 3, wherein the high-frequency amplifying element, the bias circuit, and the bias adjusting circuit are formed within a single IC chip.

21. The high-frequency amplifier circuit according to claim 4, wherein the high-frequency amplifying element, the bias circuit, and the bias adjusting circuit are formed within a single IC chip.

22. The high-frequency amplifier circuit according to claim 5, wherein the high-frequency amplifying element, the bias circuit, and the bias adjusting circuit are formed within a single IC chip.

23. The high-frequency amplifier circuit according to claim 6, wherein the high-frequency amplifying element, the bias circuit, and the bias adjusting circuit are formed within a single IC chip.

24. The high-frequency amplifier circuit according to claim 7, wherein the high-frequency amplifying element, the bias circuit, and the bias adjusting circuit are formed within a single IC chip.

25. The high-frequency amplifier circuit according to claim 8,
wherein the high-frequency amplifying element, the bias circuit, and the bias adjusting circuit are formed within a single IC chip.

* * * * *